(12) United States Patent
Chia

(10) Patent No.: US 8,780,575 B2
(45) Date of Patent: Jul. 15, 2014

(54) PRINTED CIRCUIT BOARD

(75) Inventor: Chih-Yung Chia, New Taipei (TW)

(73) Assignee: Wistron Corporation, New Taipei (TW)

( * ) Notice: Subject to any disclaimer, the term of this patent is extended or adjusted under 35 U.S.C. 154(b) by 331 days.

(21) Appl. No.: 13/082,258

(22) Filed: Apr. 7, 2011

(65) Prior Publication Data

US 2011/0247868 A1 Oct. 13, 2011

(30) Foreign Application Priority Data

Apr. 8, 2010 (TW) .............................. 99110883 A

(51) Int. Cl.
*H05K 1/18* (2006.01)
*H05K 1/02* (2006.01)
*H05K 1/11* (2006.01)
*H05K 3/00* (2006.01)
*H05K 3/28* (2006.01)

(52) U.S. Cl.
CPC ...... *H05K 1/02* (2013.01); *H05K 1/111* (2013.01); *H05K 3/0061* (2013.01); *H05K 3/28* (2013.01); *H05K 2201/0367* (2013.01); *H05K 2201/09772* (2013.01); *H05K 2201/09781* (2013.01); *H05K 2201/2036* (2013.01)
USPC ........... 361/778; 174/261; 174/555; 361/752; 361/753; 361/758; 361/809

(58) Field of Classification Search
USPC .......... 174/261, 555–560; 361/748, 752, 753, 361/758, 778, 804, 807–809, 818
See application file for complete search history.

(56) References Cited

U.S. PATENT DOCUMENTS

| | | | |
|---|---|---|---|
| 3,801,388 A * | 4/1974 | Akiyama et al. | 216/20 |
| 4,141,055 A * | 2/1979 | Berry et al. | 361/778 |
| 6,172,879 B1 * | 1/2001 | Cilia et al. | 361/778 |
| 6,627,821 B2 * | 9/2003 | Kim et al. | 174/255 |
| 6,852,932 B2 * | 2/2005 | Achari et al. | 174/262 |
| 7,351,641 B2 * | 4/2008 | Haba et al. | 438/411 |
| 8,129,837 B2 * | 3/2012 | Pendse | 257/691 |
| 2005/0276027 A1 | 12/2005 | Shen et al. | |
| 2006/0033189 A1 * | 2/2006 | Haba et al. | 257/678 |

FOREIGN PATENT DOCUMENTS

| | | |
|---|---|---|
| CN | 1707698 | 12/2005 |
| JP | 8-293661 | 11/1996 |
| JP | 20088293661 | 11/1996 |
| TW | 200601956 | 1/2006 |

OTHER PUBLICATIONS

Office Action dated Sep. 28, 2012 to corresponding Taiwanese Application No. 099110883, pp. 1-5.
CN Office Action issued in Application 2010 10153992.3, pp. 1-6; Jun. 20, 2013.

* cited by examiner

*Primary Examiner* — Lisa Lea Edmonds
*Assistant Examiner* — Christopher L Augustin
(74) *Attorney, Agent, or Firm* — Brinks Gilson & Lione

(57) ABSTRACT

A printed circuit board includes a board body having a routing-limited area. The routing-limited area is provided with at least one solder pad that is adapted for supporting a metal support thereon. Preferably, the printed circuit board further includes a protrusion block disposed on the solder pad, and having a height greater than that of a signal trace that passes the routing-limited area.

1 Claim, 6 Drawing Sheets

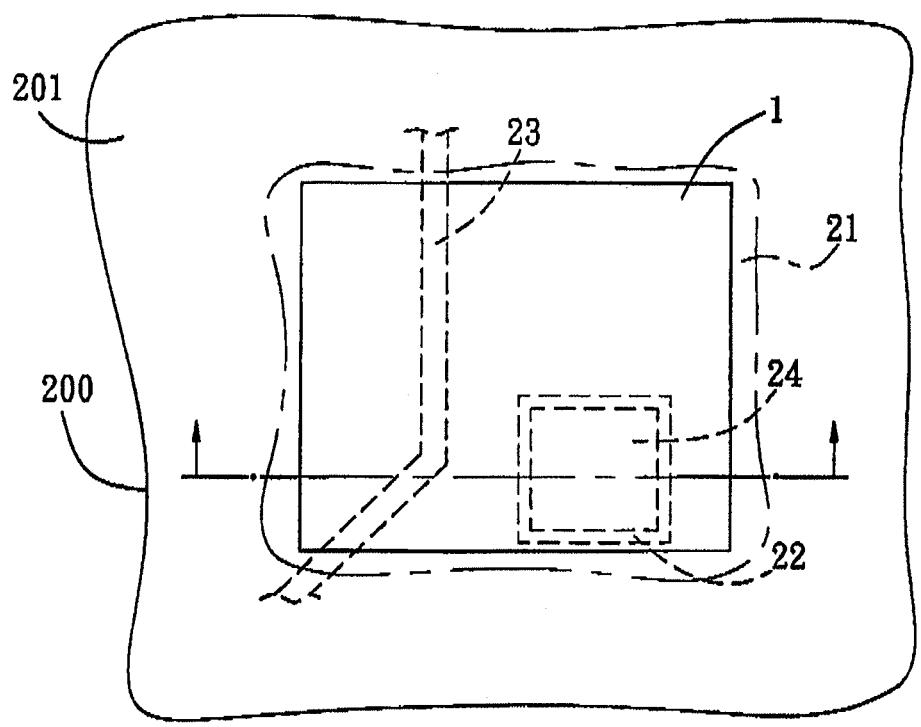
F I G. 3
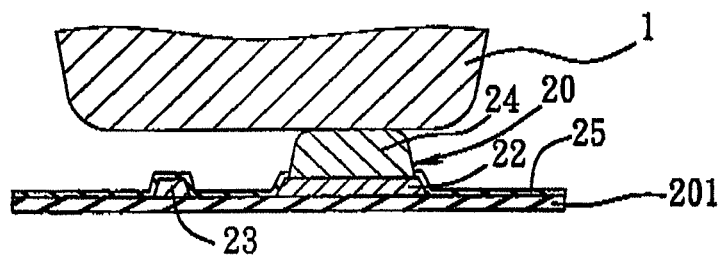
F I G. 4

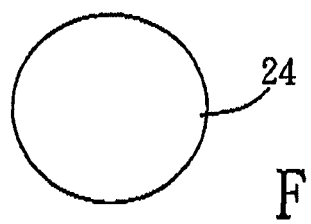
F I G. 5
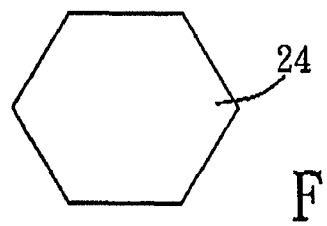
F I G. 6
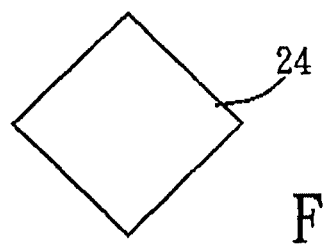
F I G. 7
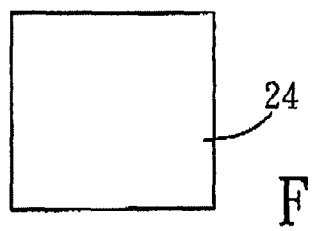
F I G. 8
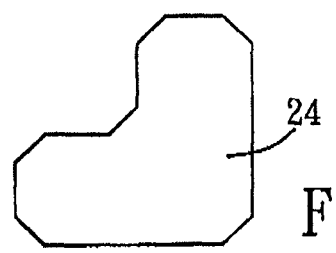
F I G. 9

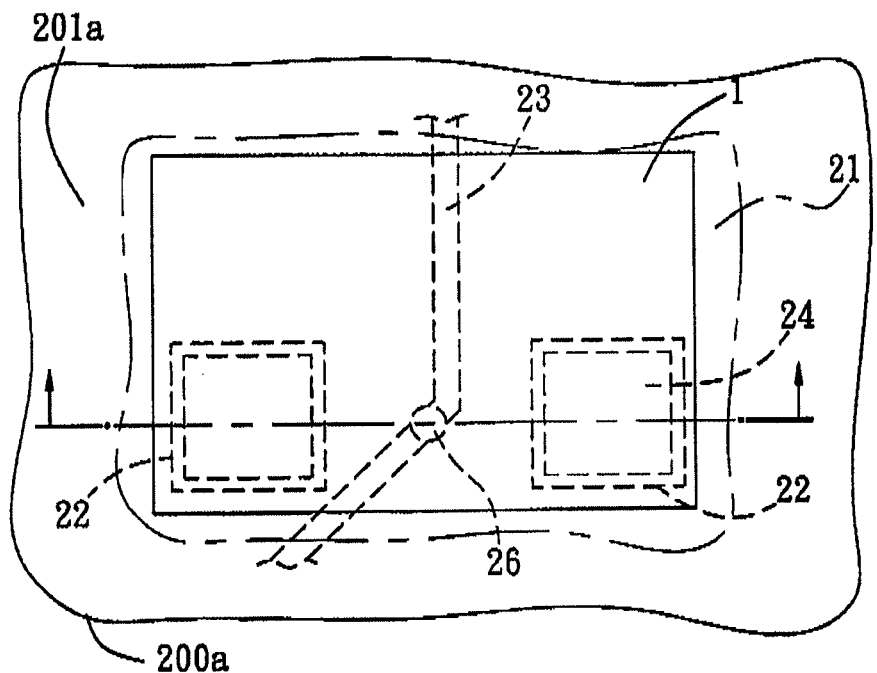
F I G. 10
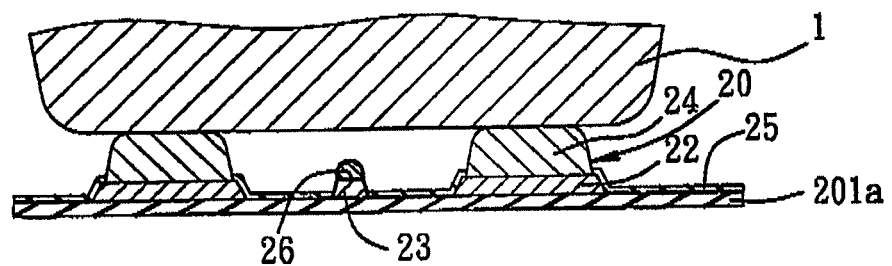
F I G. 11

PRINTED CIRCUIT BOARD

CROSS-REFERENCE TO RELATED APPLICATION

This application claims priority of Taiwanese Application No. 099110883, filed on Apr. 8, 2010.

BACKGROUND OF TEE INVENTION

1. Field of the Invention

The invention relates to a circuit board, more particularly to a printed circuit board.

2. Description of the Related Art

As shown in FIG. 1 and FIG. 2, a metal support 105 is provided in a conventional notebook computer (not shown), and is disposed between a housing (not shown) and a conventional printed circuit board 100 to enhance structural strength of the conventional notebook computer. In order to minimize electromagnetic interference and avoid creating short circuits between the metal support 105 and circuit traces on the conventional printed circuit board 100, the conventional printed circuit board 100 is configured with a routing-limited area 101 for supporting the metal support 105 thereon, in which routing in this area is prohibited. However, with the advances of notebook computers, while the size of notebook computers is to remain compact and small, the routing-limited area 101 is inevitably used for routing (i.e., having signal traces 102, test points 103 or conductive vias 104 provided thereon). In order to prevent short circuits between the metal support 105 and the signal traces 102, the test points 103 and/or the conductive vias 104, an insulating film 106 (e.g., biaxially-oriented polyethylene terephthalate (boPET), such as Mylar®) is generally provided between the metal support 105 and the conventional printed circuit board 100. However, since the metal support 105 is supported on the insulating film 106 at locations corresponding to the signal traces 102, the test points 103 and/or the conductive vias 104 at the routing-limited area 101 (only to the test point 103 in FIG. 2), whose surface areas are relatively small, the insulating film 106 tends to wear out at these locations, which may lead to short circuits.

SUMMARY OF THE INVENTION

Therefore, the object of the present invention is to provide a printed circuit board that effectively prevents a metal support from contacting a signal trace passing a routing-limited area of a board body of the printed circuit board.

According to the present invention, there is provided a printed circuit board that includes a board body having a routing-limited area. The routing-limited area is provided with at least one solder pad that is adapted for supporting a metal support thereon.

Preferably, the printed circuit board further includes a protrusion block disposed on the solder pad, adapted for supporting the metal support thereon, and having a height greater than that of a signal trace that passes the routing-limited area.

Preferably, the printed circuit board further includes a test point that is disposed on the signal trace at the routing-limited area, and that has a height greater than that of the signal trace. The protrusion block has a height greater than that of the test point.

Preferably, the printed circuit board further includes a conductive via that is provided in the routing-limited area through the signal trace and that is defined by a via wall. The protrusion block has a height greater than that of the via wall.

The effects and advantages of the present invention lie in that by providing the protrusion block in the routing-limited area of the board body of the printed circuit board for supporting the metal support, the metal support is elevated, and is prevented from contacting the signal trace, the test point on the signal trace, or the conductive via, thereby avoiding the risk of creating short circuits.

BRIEF DESCRIPTION OF THE DRAWINGS

Other features and advantages of the present invention will become apparent in the following detailed description of the preferred embodiments with reference to the accompanying drawings, of which:

FIG. 3 is a fragmentary schematic top view of the first preferred embodiment of a printed circuit board according to the present invention;

FIG. 4 is a fragmentary sectional view of the first preferred embodiment;

FIG. 5 is a schematic diagram, illustrating a possible shape for the protrusion block;

FIG. 6 is a schematic diagram, illustrating a possible shape for the protrusion block;

FIG. 7 is a schematic diagram, illustrating a possible shape for the protrusion block;

FIG. 8 is a schematic diagram, illustrating a possible shape for the protrusion block;

FIG. 9 is a schematic diagram, illustrating a possible shape for the protrusion block;

FIG. 10 is a fragmentary schematic top view of the second preferred embodiment of a printed circuit board according to the present invention;

FIG. 11 is a fragmentary sectional view of the second preferred embodiment;

DETAILED DESCRIPTION OF THE PREFERRED EMBODIMENTS

Figure 1:
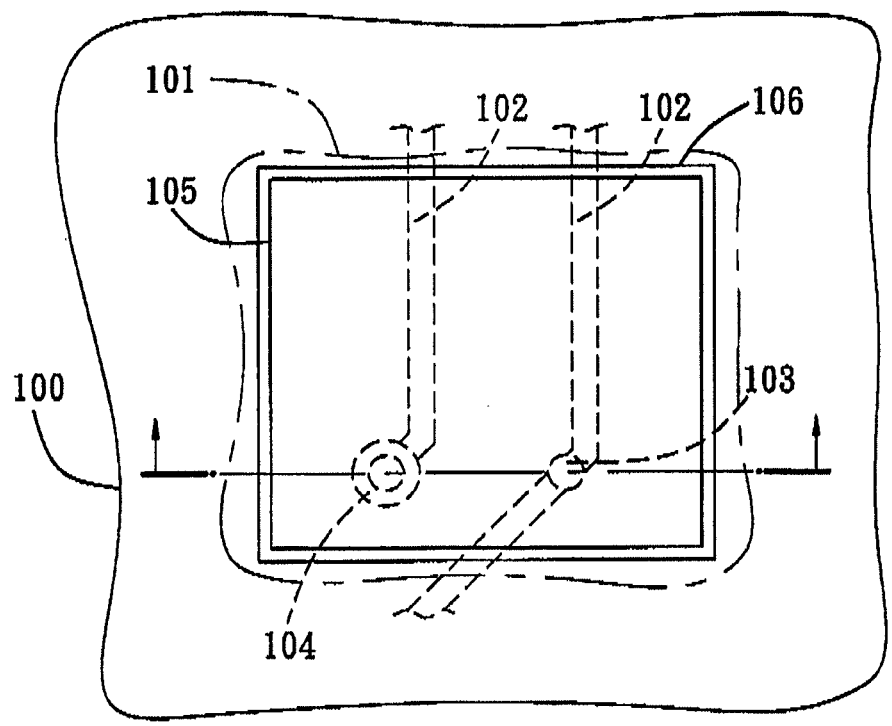
FIG. 1 is a fragmentary schematic top view of a conventional printed circuit board.
Figure 2:
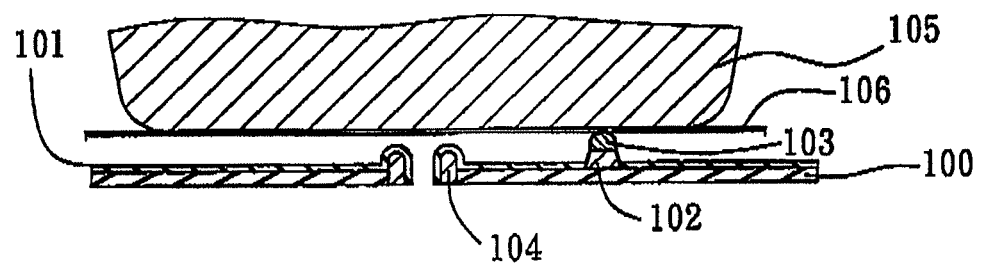
FIG. 2 is a fragmentary sectional view of the conventional printed circuit board.

Before the present invention is described in greater detail, it should be noted that like elements are denoted by the same reference numerals throughout the disclosure.

With reference to FIG. 3 and FIG. 4, the first preferred embodiment of a printed circuit board 200 according to the present invention is adapted to be disposed in a portable electronic product, such as a notebook computer (not shown) or a tablet computer (not shown). Due to the portability requirement, portable products are generally required to be fairly compact in size. Therefore, it is normal for a housing (not shown) of the portable product to have a small height. A metal support 1 is used to enhance structural strength of the portable product, and is disposed between the housing and the printed circuit board 200. Accordingly, the printed circuit board 200 has a board body 201 that is configured with an area that is adapted to have the metal support 1 disposed thereabove. While it is generally not desirable to have circuit traces in this area, due to the compact requirement of portable products, this area is inevitably used for routing in order to minimize the overall size of the printed circuit board 200. Thus, this area is designated as a routing-limited area 21 herein.

In order to prevent short circuits from being created between the metal support 1 and circuit traces in the routing-limited area 21, during layout of the printed circuit board 200, the routing-limited area 21 is so designed as to be provided with at least one solder pad 22 that is adapted for supporting the metal support 1 thereon. As shown in FIG. 3, the printed circuit board 200 further includes a signal trace 23 that passes the routing-limited area 21. The solder pad 22 is spaced apart from the signal trace 23. In addition, the printed circuit board 200 further includes a protrusion block 24 disposed on the solder pad 22. The protrusion block 24 is preferably a metal material that is soldered to the solder pad 22. In this embodiment, the protrusion block 24 is a tin block that is made by melting tin paste (solder paste) in a tin furnace. The protrusion block 24 has a height greater than that of the signal trace 23. As shown in FIGS. 5 to 9, the protrusion block 24 is not limited in the shape thereof, i.e., the protrusion block 24 may be circular, hexagonal, quadrilateral (rhomboidal, rectangular) or any irregular shape. As such, when the metal support 1 presses down on the printed circuit board 200 due to external forces, the metal support 1 will abut against the protrusion block 24, which prevents the signal trace 23 adjacent thereto from being contacted by the metal support 1. Therefore, the metal support 1 is not likely to damage a protective coating 25 coated on the signal trace 23, and is effectively prevented from directly contacting the signal trace 23, thereby preventing the creation of a short circuit between the metal support 1 and the signal trace 23. In other words, the solder pad 22 and the protrusion block 24 cooperatively define an "isolation island" 20 for separating the metal support 1 from the signal trace 23.

As shown in FIGS. 10 and 11, the second preferred embodiment of a printed circuit board according to the present invention is substantially similar to the first preferred embodiment, and only differs from the first preferred embodiment in that the printed circuit board 200a of the second preferred embodiment further includes a test point 26 that is disposed on the signal trace 23 at the routing-limited area 21 of the board body 201a and that has a height greater than that of the signal trace 23. The protrusion block 24 on the solder pad 22 has a height greater than that of the test point 26. As such, when the metal support 1 presses down on the printed circuit board 200a due to external forces, the metal support 1 will abut against the protrusion block 24, and will not contact the signal trace 23 or the test point 26 adjacent to the protrusion block 24 and result in a short circuit. In this embodiment, the routing-limited area 21 is provided with two of the solder pads 22 that are spacedly disposed on opposite sides of the test point 26, as well as the signal trace 23. Accordingly, there are two of the protrusion blocks 24 disposed respectively on the solder pads 22. The provision of multiple solder pads 22 and protrusion blocks 24 provides more stable support for the metal support 1.

Figure 12:
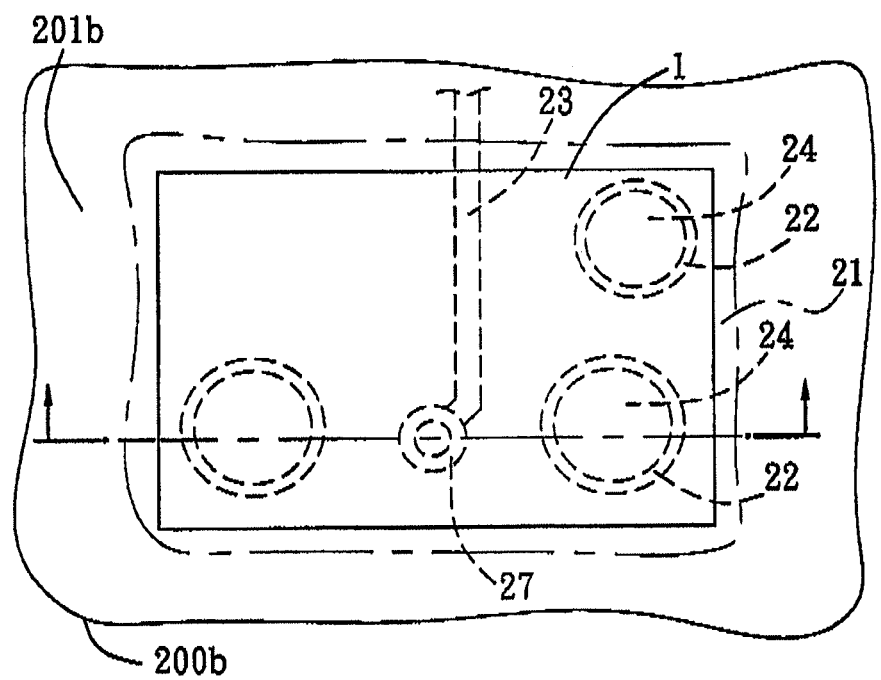
FIG. 12 is a fragmentary schematic top view of the third preferred embodiment of a printed circuit board according to the present invention.
Figure 13:
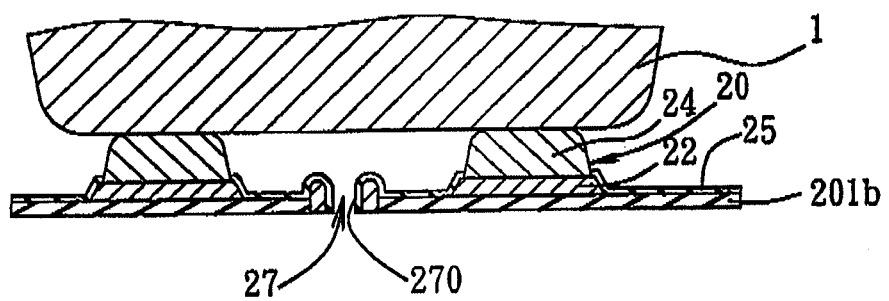
FIG. 13 is a fragmentary sectional view of the third preferred embodiment.

With reference to FIG. 12 and FIG. 13, the third preferred embodiment of a printed circuit board 200b according to the present invention is substantially similar to the first preferred embodiment, and only differs from the first preferred embodiment in that the printed circuit board 200b of the third preferred embodiment further includes a conductive via 27 that is provided in the routing-limited area 21 of the board body 201b through the signal trace 23 and that is defined by a via wall 270. The protrusion block 24 has a height greater than that of the via wall 270. In this embodiment, there are three of the solder pads 22 and three of the protrusion blocks 24 to enhance stability of supporting the metal support 1. As such, when the metal support 1 presses down on the printed circuit board 200b due to external forces, the metal support 1 will abut against the protrusion blocks 24, and will not contact the via wall 270 and the signal trace 23 adjacent to the protrusion blocks 24 and result in short circuits. It is noted herein that the solder pads 22 and the protrusion blocks 24 are illustrated to be circular in this embodiment, while being illustrated as rectangular in previous embodiments. As mentioned earlier, there is no limitation as to the shapes of the solder pads 22 and the protrusion blocks 29.

Figure 14:
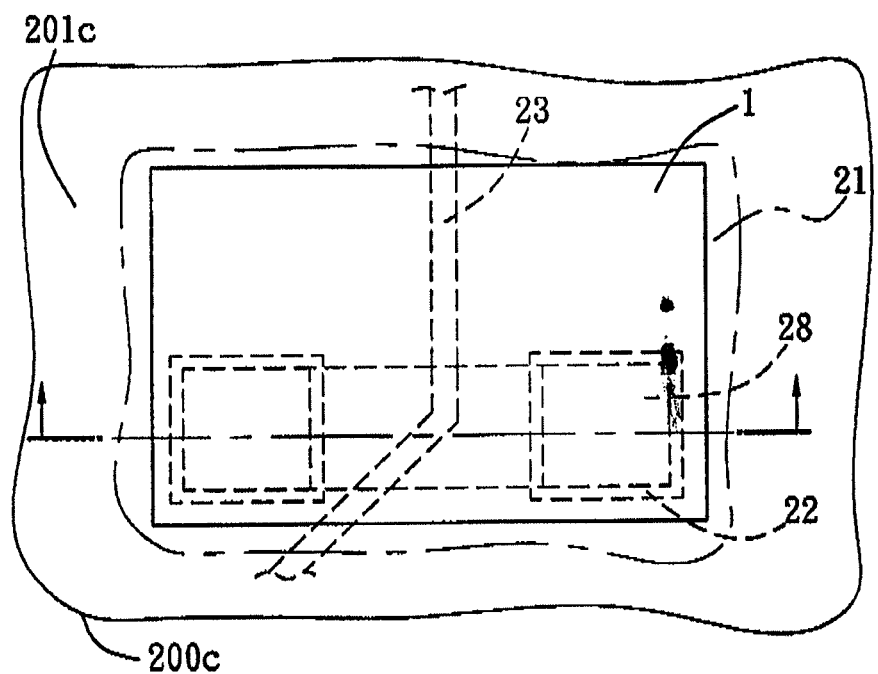
FIG. 14 is a fragmentary schematic top view of the fourth preferred embodiment of a printed circuit board according to the present invention.
Figure 15:
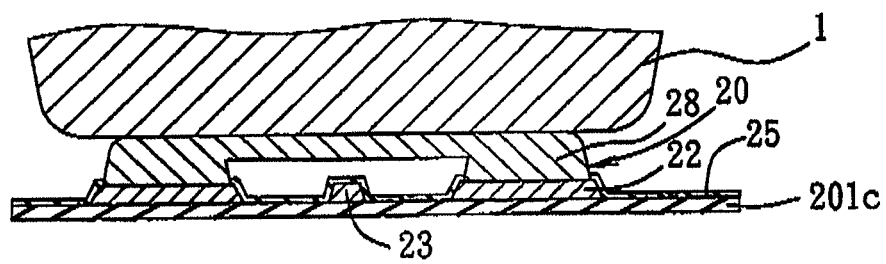
FIG. 15 is a fragmentary sectional view of the fourth preferred embodiment.

With reference to FIG. 14 and FIG. 15, the fourth preferred embodiment of a printed circuit board 200c according to the present invention is substantially similar to the second preferred embodiment, and differs from the second preferred embodiment in that the printed circuit board 200c of the fourth preferred embodiment is not provided with the test point 26, and further includes an inverted-U-shaped metal separating member 28 in place of the protrusion blocks 24 (as shown in FIG. 10 and FIG. 11). The metal separating member 28 straddles the signal trace 23 passing the routing-limited area 21 of the board body 201c, and has two ends, which are respectively connected to the solder pads 22 that are disposed on the opposite sides of the signal trace 23. The metal separating member 28 is a substitute for the protrusion blocks 24 used in the previous embodiments, and provides a more stable separation between the metal support 1 and the signal trace 23.

It is noted herein that there are no limitations as to the number, size, height and location for the solder pad 22, the protrusion block 24 and the metal separating member 28, as long as they facilitate elevation of the metal support 1 to an extent that the metal support 1 is prevented from contacting the signal trace 23, the test point 26 and/or the conductive via 27 at the routing-limited area 21.

In summary, the present invention provides at least one solder pad 22 in a routing-limited area 21 of a board body 201 of a printed circuit board 200, and a protrusion block 24 or a metal separating member 28 disposed on the corresponding solder pad(s) 22 in order to separate a metal support 1 to be disposed above the routing-limited area 21 from a signal trace 23 passing the routing-limited area 21, a test point 26 disposed on the signal trace 23, and/or a conductive via 27 provided through the signal trace 23, thereby effectively preventing short circuits.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A printed circuit board, comprising:
   a board body having a routing-limited area, wherein said routing-limited area is provided with at least one solder pad that is adapted for supporting a metal support thereon;
   a signal trace that passes said routing-limited area, wherein said routing-limited area is provided with a plurality of said solder pads that are spacedly disposed on opposite sides of said signal trace; and
   an inverted-U-shaped metal separating member that straddles said signals trace, and that has two ends, which are respectively connected to said solder pads that are disposed on said opposite sides of said signal trace, wherein said inverted-U-shaped metal separating member has at least one open side to permit passage of said signal trace therethrough.

* * * * *